United States Patent [19]
Spence

[11] Patent Number: 4,685,085

[45] Date of Patent: Aug. 4, 1987

[54] NON-VOLATILE RAM CELL WITH CHARGE PUMPS

[75] Inventor: John R. Spence, Villa Park, Calif.

[73] Assignee: Rockwell International Corporation, El Segundo, Calif.

[21] Appl. No.: 745,746

[22] Filed: Jun. 17, 1985

[51] Int. Cl.⁴ .............................................. G11C 7/00
[52] U.S. Cl. .................................... 365/190; 365/185
[58] Field of Search ............... 365/190, 185, 228, 226, 365/156, 189, 182

[56] References Cited

U.S. PATENT DOCUMENTS

| | | | |
|---|---|---|---|
| 3,676,717 | 7/1972 | Lockwood | 365/228 |
| 4,064,492 | 12/1977 | Schwermeyer et al. | 365/184 |
| 4,091,460 | 5/1978 | Schuermeyer et al. | 365/154 |
| 4,263,664 | 4/1981 | Owen et al. | 365/185 |
| 4,271,487 | 6/1981 | Craycraft et al. | 365/189 |
| 4,326,134 | 4/1982 | Owen et al. | 307/268 |
| 4,375,086 | 2/1983 | van Velthoven | 365/149 |
| 4,393,481 | 7/1983 | Owen et al. | 365/228 |

Primary Examiner—Joseph A. Popek

Attorney, Agent, or Firm—H. Fredrick Hamann; George A. Montanye; David J. Arthur

[57] ABSTRACT

A random access memory cell includes a volatile RAM cell, a non-volatile RAM cell and a transfer control circuit connected between the volatile and non-volatile elements. The volatile element includes two nodes and has two stable states. The non-volatile element also includes two nodes, each of which is connected to one of the nodes of the volatile element. The non-volatile element preferably includes a floating gate field effect transistor used as a storage transistor and connected between the two nodes of the non-volatile element to store a charge corresponding to the state of the non-volatile element. A second floating gate field effect transistor is coupled to the storage transistor to be used as a sense transistor. The transfer control circuit selectively connects the sense transistor to one of the nodes of the volatile element to cause the volatile element to adopt the state represented by the charge on the storage transistor of the non-volatile element. A pair of charge pumps in the non-volatile element supply the voltage to the nodes of the non-volatile element to properly program the storage transistor.

20 Claims, 3 Drawing Figures 4,685,085

NON-VOLATILE RAM CELL WITH CHARGE PUMPS

FIELD OF THE INVENTION

This invention relates generally to electronic memory circuitry and pertains particularly to non-volatile random access memory.

BACKGROUND OF THE INVENTION

Electronic semiconductor memories are used in computers and other devices for storing information. The information is encoded into binary bits, which are stored in cells of the memory, with the value of each bit being represented by the electrical state of a cell. An electronic memory may be of the random access type, which readily allows changes to be made in the stored information, or of the read only type, which does not.

A computer is supplied with power from an external source, such as a battery or a connection to a utility power line. The power supplied to the computer generally is also supplied to the memories within the computer. For many applications, it is desirable that the information stored in a memory not be lost when the source of power (i.e. battery or utility power) is disconnected from the memory. For example, if a lengthy program is stored in a computer memory, it may be desirable that the program not be lost when the computer power is shut down, so that the program will be present in the memory when the computer power is turned on again. Memories that maintain their contents after loss of power are termed "non-volatile." Ferrite core memories are exemplary of non-volatile memories.

Memories that lose their contents after loss of power are termed "volatile". Semiconductor random access memories (RAMs) made using simple MOSFETs (metal oxide semiconductor field effect transistors) are exemplary of volatile memories. Generally, volatile memories are capable of high speed, low power operation, whereas non-volatile random access memories (NVRAMs) require more power and operate at lower speeds. Various specialized electronic semiconductor memories, including electrically-alterable read only memories (EAROMs) or electrically erasable programmable read only memories (EEPROMs), have been made to allow in-circuit changes in the data stored in read only memories. However, such devices generally require large amounts of time for reprogramming.

Others have recognized the need to combine the speed and low power consumption of a typical MOSFET RAM with a non-volatile memory capability. A reference discussing several possible solutions is U.S. Pat. No. 4,271,487, issued June 2, 1981 to Donald G. Craycraft et al, and assigned to NCR Corporation. That patent describes three circuits that are associated with a conventional volatile RAM element to provide non-volatile memory associated with each RAM element. Each of those circuits includes a pair of non-volatile capacitors for storing charges representative of the memory element state to be stored. Each non-volatile capacitor is connected to one of the output nodes of the volatile memory cell and includes a threshold alterable portion. When the state of the volatile RAM element is stored in the non-volatile capacitors, the threshold of the threshold-alterable portion of one or the other of the capacitors is altered, depending on the state being stored. When the power is again connected to the memory cell, and the state stored in the non-volatile portion is to be re-transferred to the volatile element, the threshold-alterable portion is turned on in one capacitor, and in the other capacitor the threshold portion is kept off, causing the two capacitors to present different capacitances to the two volatile RAM output nodes. As a result, the voltage of the two output nodes will rise at different rates. This difference in the rate of voltage rise causes the volatile portion of the element to assume the state represented by the stored charges.

The component values and tolerances for the capacitive volatile/non-volatile RAM cell of this type must be very carefully controlled to insure that the proper capacitance is applied to the cell so that the state of the cell is accurately stored on the non-volatile element and, more critically, accurately read out from the non-volatile element onto the volatile element. Slight changes or inaccuracies in the storage capacitors may result in an undesirable change in the rate of voltage rise for one or both sides of the volatile memory element, leading to inaccuracies in rewriting the volatile element.

SUMMARY OF THE INVENTION

Therefore, it is an object of this invention to provide a non-volatile random access memory providing accurate, high-speed, low power operation.

Another object of this invention is to provide a semiconductor memory requiring relatively few and compact components so that the memory circuitry may readily be incorporated in a high density integrated circuit chip.

A further object of the invention is to provide, in a memory cell incorporating a high speed volatile RAM cell with an associated non-volatile cell, direct and positive transfer of the state of the non-volatile cell to the volatile cell.

Yet another object of the invention is to provide reliable transfer of data between a volatile RAM cell and an associated non-volatile memory cell using a minimum of power.

The memory cell circuit of the invention includes a volatile RAM flip-flop that has first and second stable states and means for establishing the flip-flop in its first stable state. The memory cell further includes a non-volatile storage element having two states. A transfer circuit connected to the flip-flop and to the non-volatile element causes the flip-flop to either retain its established first state or flip to its second state in response to the state of the non-volatile element. Preferably, the non-volatile element includes a terminal that is caused to have a predetermined voltage when the non-volatile element is in its second state, corresponding to the second state of the flip-flop. The transfer circuit selectively connects the volatile element to the terminal, after the flip-flop has been established in its first state, so that when the terminal has the predetermined voltage the flip-flop changes to its second state.

The charge storage device is preferably a floating gate MOSFET, and the memory cell circuit additionally includes a first charge pump connected to the gate of the charge storage MOSFET and a second charge pump connected to the diffusion of the charge storage MOSFET. The first charge pump is turned on to apply a voltage to the gate of the charge storage device and place a first charge on the floating gate to place the non-volatile element in its first state. To place the non-volatile element in its second state, the second charge pump is turned on to apply a voltage to the diffusion of the charge storage device and place a second charge on the floating gate.

To non-volatilely store a data bit according to the invention, a state representative of the data bit is established in a volatile flip-flop memory cell having two stable states. That flip-flop state is transferred to a non-volatile cell, and a charge representative of that state is stored on a charge storage device. To retrieve the non-volatilely stored bit, a predetermind one of the flip-flop stable states is established in the flip-flop. Then the charge on the charge storage device is sensed to cause the volatile cell to either flip state or remain in its established predetermined state, depending on the charge stored on the charge storage device.

DESCRIPTION OF THE PREFERRED EMBODIMENT

Figure 1:
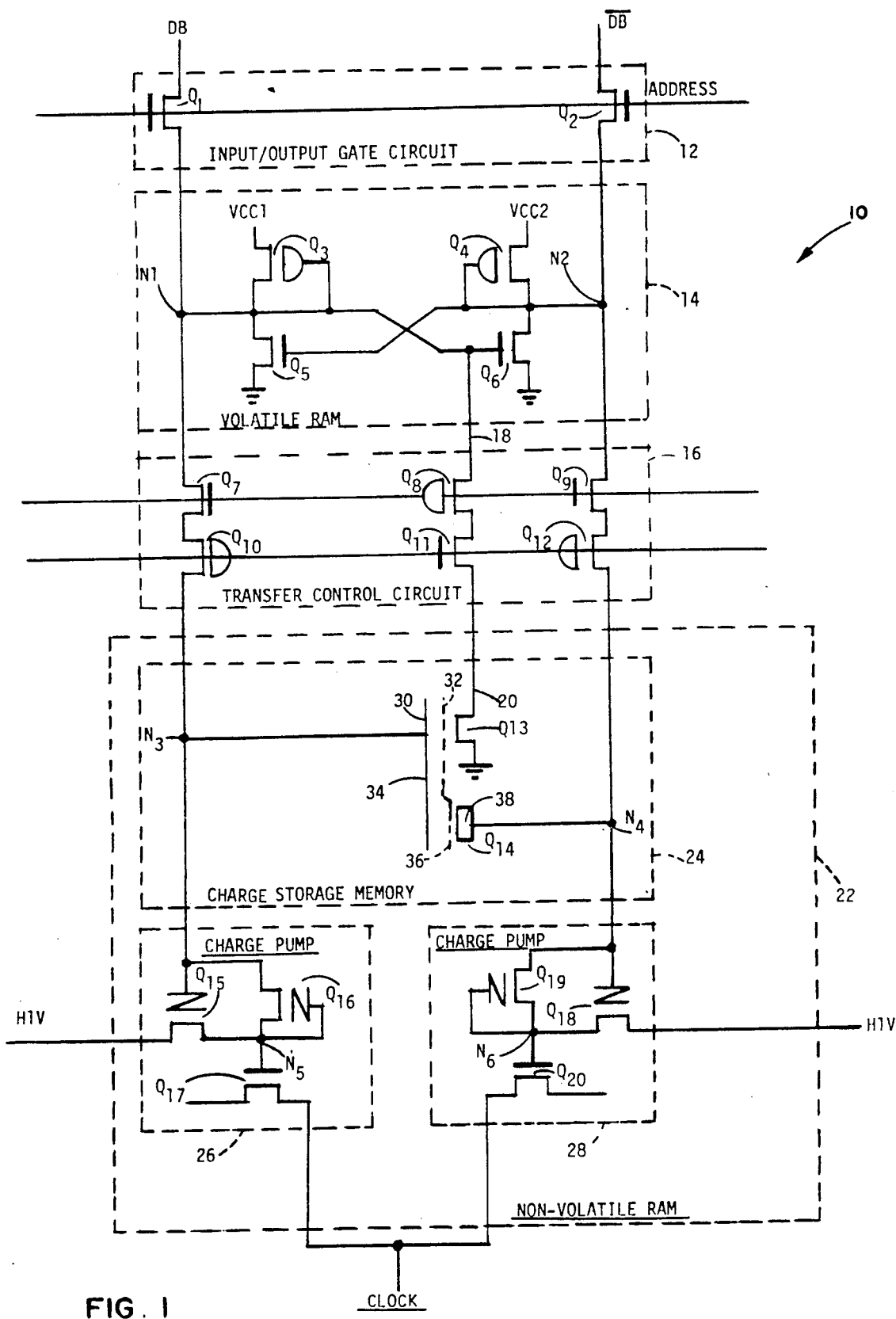
FIG. 1 is an electrical schematic drawing of the circuitry for the preferred embodiment of the non-volatile random access memory cell incorporating the invention.

Referring first to FIG. 1, the non-volatile random access memory (RAM) cell 10 allows for the storage and retrieval of data in the form of electrical signals transferred to and from an external data bus having bus lines DB and $\overline{DB}$. The cell 10 has an input/output gate circuit 12, a volatile RAM element 14, a transfer control circuit 16, and a non-volatile RAM element 22.

The Gate Circuit 12

The input/output gate circuit 12 controls the transfer of data to and from the volatile RAM element 14. The gate circuit 12 is preferably substantially conventional and includes addressing transistors MOSFETs Q1, Q2 having their gate electrodes connected to an external ADDRESS signal line. The transistor Q1 has its channel connected between a data bus line (DB) and a first node N1 of a volatile RAM element 14. The transistor Q2 has its channel connected between an inverted data bus line ($\overline{DB}$) and a second node N2 of the volatile memory element 14. Thus, an external computer data bus circuit can be connected to the memory cell by the lines DB and $\overline{DB}$.

External electrical addressing signals may be applied to the ADDRESS line to turn the transistors Q1 and Q2 on and off and thus control the transfer of data to and from the memory cell. The addressing transistors Q1, Q2 are preferably enhancement mode n-channel MOSFETs so that the transistors Q1, Q2 are off (or non-conductive) when the ADDRESS line is zero volts, and are on (or conductive) when the ADDRESS line is approximately five volts. When the addressing or gate transistors Q1, Q2 are off, electrical signals are not allowed to flow between data bus line DB and a first node N1 of the memory, nor between the inverted data bus line $\overline{DB}$ and a second node N2 of the memory. When the transistors Q1, Q2 are on, electrical signals are allowed to flow back and forth between the line $\overline{DB}$ and the first node N1, and between the line $\overline{DB}$ and the node N2.

The Volatile Memory Element 14

The volatile RAM element 14 is preferably substantially similar to a conventional static RAM having two stable states and two nodes N1, N2. Each stable state of the volatile element 14 represents one of the two possible states for the bit stored in that element.

In one stable state, the voltage on the first node N1 is high relative to the voltage on the second node N2. In the other stable state of the volatile memory element 14, the voltage on the first node N1 is low relative to the voltage on the second node N2. The state of the memory cell is determined by the transistors Q3, Q4, Q5, Q6, which are controlled by the signals received on the data bus lines DB, $\overline{DB}$.

In its preferred form, the volatile RAM element 14 has n-channel depletion mode MOSFETs Q3 and Q4, and n-channel enhancement mode MOSFETs Q5 and Q6. The MOSFET Q3 has its channel connected between a first voltage source line VCC1 and the first node N1, and has its gate connected to the node N1. The MOSFET Q4 has its channel connected between a second voltage source line VCC2 and the second node N2, and has its gate connected to the node N2. The MOSFET Q5 has its channel connected between the first node N1 and ground, and has its gate connected to the second node N2. The MOSFET Q6 has its channel connected between the second node N2 and ground, and has its gate connected to the first node N1.

The first voltage supply line VCC1 is preferably maintained at approximately five volts potential. The second voltage supply line VCC2 is preferably also kept at approximately five volts potential, except at a time just before the state of the non-volatile RAM element 22 is recalled, as is discussed below in connection with FIG. 3 and the Recall operation.

In the first stable state for the volatile element 14, in which the voltage on the first node N1 is high relative to the second node N2, the depletion MOSFET Q3 is on, so the voltage of the first node is at the potential of the voltage source line VCC1, and the enhancement MOSFET Q6 is turned on to pull the second node N2 to ground potential. This occurs because MOSFET Q6 has a relatively low impedance in its on state compared to the relatively high impedance of second depletion FET Q4.

In the second stable state for the volatile element 14, in which the voltage on the second node N2 is high relative to the first node N1, the MOSFET Q4 is on, to bring the voltage of the second node N2 to the potential of the second voltage supply line VCC2. The MOSFET Q5 is also turned on by the raised voltage on the second node, drawing the voltage of the first node N1 to ground.

The state of the volatile memory element 14 may be changed by applying voltages to the data bus lines DB and $\overline{DB}$, and gating the voltage signals to the nodes N1 and N2 by placing an address enable signal on the ADDRESS line to turn the gate transistors Q1, Q2 on. The state of the volatile element 14 may be sensed by placing an address enable signal on the ADDRESS line to turn the gate transistors Q1, Q2 on, and then sensing the voltage produced on the lines DB and $\overline{DB}$.

When the voltages on the supply lines VCC1 and VCC2 are both made zero, as when the power is removed from the cell, the stable state of the element 14 is not maintained and the information contents of the element 14 is lost; hence, the volatility of the RAM element 14.

The Transfer Control Circuit 16

The transfer control circuit 16 controls the back-and-forth transfer of electrical signals between the volatile memory element 14 and the non-volatile memory element 22. The control circuit 16 acts as three gates, two of which control the transfer of information from the volatile element 14 to the non-volatile element 22, and the third of which controls the transfer of information from the non-volatile element 22 to the volatile element 14. Those gates are controlled by external electrical signals applied to the lines STORE and RECALL.

A first gate of the transfer control circuit 16 comprises an n-channel enhancement mode MOSFET Q7 having its channel connected between the first node N1 of the volatile RAM element 14 and a node N3 of the non-volatile element 22. This first transfer control gate governs the transfer of the state of the first node N1 of the volatile element 14 to the third node N3 in the non-volatile element 22 during the storing of the state of the volatile element in the non-volatile element.

A second gate of the transfer control circuit 16 controls the recall of the state of the non-volatile memory element 22 to the volatile memory element 14. The gate includes an enhancement mode MOSFET Q11 connected between a sensing input line 18 of the volatile element and a sensing output line 20 of the non-volatile element. The sensing input line 18 is, in the preferred embodiment shown, connected to the first node N1 of the volatile element.

The sensing output line 20 of the non-volatile element 22 is connected to a sensing transistor Q13, which is responsive to a storage transistor Q14 to indicate the state stored in the non-volatile element, as will be described below in connection with the detailed description of the non-volatile element 22.

A third gate of the transfer control circuit 16 includes an enhancement mode MOSFET Q9 having its channel connected between the second node N2 of the volatile element and a fourth node N4, in the non-volatile element 22. That third gate controls the transfer of the state of the second node N2 to the fourth node N4 to store the state of the volatile element 14 in the non-volatile element 22.

Thus, the first and third gates control the transfer of the state of the volatile memory element 14 to the non-volatile memory element 22 during the Store operation. The second gate governs the transfer of the state of the non-volatile element 22 to the volatile element 14 during the Recall operation.

Each gate may include a depletion transistor Q8, Q10, Q12. Although those elements serve no functional purpose in the circuit, they are included for layout convenience in constructing the memory circuit.

The gates of the MOSFETs Q7, Q8, and Q9 are connected in parallel to the line STORE so signals on the STORE line can control their operation. The gates of the MOSFETs Q10, Q11, and Q12 are connected in parallel to the line RECALL so the operation of those MOSFETs is controlled by signals on the RECALL line.

The signals on the STORE and RECALL lines operate the transfer control circuit 16 to govern the transfer of information between the volatile element 14 and non-volatile element 22 of the RAM cell 10. The operation of the transfer control circuit during the store and recall operations will be explained below in connection with FIGS. 2 and 3.

The Non-volatile Memory Element 22

The state of the memory cell 10 can be retained for extended periods of time in the non-volatile memory element 22. The non-volatile element 22 retains its state when power is removed from the circuit, unlike the volatile memory element 14, which loses its state when the power is removed from the voltage input lines VCC1, VCC2. The non-volatile element 22 has two states, which correspond to the two states of the volatile element 14.

The non-volatile RAM element 22 includes a charge storage memory 24 for retaining a charge representative of the state of the memory cell, and first and second charge pumps 26, 28 for applying to the charge storage memory 24 the voltages necessary to program the appropriate state into the memory 24.

The charge storage memory 24 has two nodes N3, N4, a memory or storage element Q14, and a sensing element Q13. The storage element Q14 and the sensing element Q13 are preferably floating gate n-channel enhancement mode MOSFETs. The state of the volatile element 14 to be stored in the memory 24 is received through the transfer control circuit 16 onto the nodes N3, N4. To recall the state of the non-volatile memory 22 to the volatile element 14, the state of the memory 24 is output on the output line 20 through the transfer control circuit to the volatile element 14.

The storage member Q14 has a control gate 34 and a floating gate 36 between the control gate 34 and the diffusion 38. The dielectric between the floating gate 36 and the diffusion 38 is very thin (approximately 100 Angstroms), so charges can be readily moved between the floating gate and the diffusion. A charge is stored on the floating gate of the charge storage transistor Q14 by applying a relatively high voltage (approximately 20 volts) between the control gate 34 and the diffusion 38.

The sensing element Q13 also has a control gate 30, a channel connected between the output line 20 and a predetermined voltage, preferably ground potential, and a floating gate 32 between the control gate and the channel. The floating gate 32 of the sense element Q13 is connected to the floating gate 36 of the storage element Q14 so the charge stored on the floating gate of the storage element is transferred to the sensing element. The charge on the floating gate 32 changes the threshold at which the sensing transistor Q13 is rendered conductive. For example, if a negative charge has been stored on the floating gate 36 of the storage element Q14 and transferred to the floating gate 32 of the sensing element Q13, a larger positive voltage must be applied to the gate 30 to cause the channel of the transistor Q13 to be conductive than would be the case if a positive charge were stored on the floating gate 32. As will be explained, that ability to alter the threshold voltage allows the sensing element Q13 to transfer the state of the storage member Q14 to the volatile element 14.

Charge pumps 26, 28 are used in the non-volatile memory element 22 to apply the appropriate high voltage across the storage element Q14 to properly program the storage member Q14. When the state of the volatile element 14 is transferred to the third and fourth nodes N3, N4 through the transfer control circuit 16, one or the other of the charge pumps 26, 28 is activated to step-wise increase the voltage on its associated node N3, N4, until virtually the full voltage of a voltage supply line HIV is applied across the storage member Q14.

The first charge pump 26 includes three MOSFETs Q15, Q16, Q17, which are used to apply a high voltage signal from an external high voltage source to the node N3 of the charge storage memory 24. The MOSFETs Q15, Q16 are preferably natural MOSFETs, which have essentially no threshold, and thus turn on upon the application of very little voltage to the gate.

The first natural MOSFET Q15 has its channel connected between the external high voltage source line HIV and a charge pump node N5, and has its gate connected to the memory node N3. The high voltage source line HIV is connected to an external source of approximately 20 volts. Preferably, the twenty volts is obtained from the five volt source used in the memory circuit 10 by a capacitive voltage multiplier. The second natural MOSFET Q16 has its channel connected between the node N3 and the node N5, and has its gate connected to the node N5. The enhancement MOSFET Q17 has its source connected to an external CLOCK signal line, its drain unconnected or floating, and its gate coupled to the node N5 to be used as a volatile controlled capacitor. The MOSFET Q17 capacitively couples the external clock signal from the CLOCK line to the node N5.

The use of natural MOSFETs Q15, Q16 having a threshold of virtually zero to connect the high voltage line HIV to the charge pump node N5 and to connect the charge pump node N5 to the memory node N3, and an enhancement mode MOSFET Q17 to capacitively couple the clock signal to the pump node N5 provides a charge pump that is sensitive to turn-on, insensitive to turn-off, and provides high gain. The charge pump 26 turns on readily, does not turn off prematurely, and yields a rather rapid increase in the voltage at the memory node N3.

When a voltage appears at the memory node N3, the natural MOSFET Q15 is turned on, making the high voltage on the high voltage supply line HIV available to the charge pump node N5. The potential of the charge pump node N5 rises to the potential of the memory node N3; but, the potential of the charge pump node N5 cannot rise to a level higher than that of the storage node N3. The MOSFET Q16 remains off. In the typical operation of the memory cell 10 a voltage of 3.5 volts may be applied at the node N3 through the transfer control circuit gate Q7. Thus, 3.5 volts will also appear at the charge pump node N5. The voltage at the node N5 exceeds the threshold of the enhancement MOSFET Q17, so the signal on the CLOCK line is capacitively coupled to the pump node N5. When a pulse appears in the signal on the CLOCK line, the voltage of the signal pulse capacitively adds to the existing potential of the node N5. In the typical circuit, the clock signal has a 5 volt pulse, so the potential of the node N5 will be increased to approximately 8.5 volts. With the gate potential of the natural MOSFET Q16 higher than the drain, that MOSFET turns on. Charge is pumped to the memory node N3 to raise its potential to that of the charge pump node N5, less any loss across the natural MOSFET Q16, or to almost 8.5 volts. On the next pulse of the signal on the CLOCK line, the potential of the pump node N5 is again raised by the pulse voltage through the capacitance of the enhancement MOSFET Q17, to approximately 13.5 volts. That increased voltage again turns on the natural MOSFET Q16 to pump charge to the memory node N3 and raise the voltage of that node to a level somewhat less than 13.5 volts. The voltage of the node N3 is thus increased at each pulse of the signal on the CLOCK line. The frequency of the pulse signal on the CLOCK line is preferably approximately 1 MHz. As the voltage of the memory node N3 increases, though, the transfer through the natural MOSFET Q16 becomes somewhat less efficient, and each successive voltage increase becomes less. After a number of clock pulses, the voltage of the memory node approaches an asymptote near the level of the high voltage supply line HIV, which is typically about 20 volts.

The speed with which the potential of the node N3 rises depends upon the ratio of the capacitance of the enhancement MOSFET Q17 and the parasitic capacitance at the node N3. The capacitance of the enhancement MOSFET Q17 is in series with the parasitic capacitance at the third memory mode N3, so the greater the capacitance of the MOSFET Q17 relative to the parasitic capacitance, the faster the voltage at the node N3 will build; however, in most devices, too fast a rise time is undesirable, as, when all the memory cells are being stored simultaneously prior to powering down the machine, that rapid voltage rise would require a large current from the high voltage source. The ideal capacitance ratio will be different for different applications.

The second charge pump 28 is essentially identical to the first charge pump 26. The second charge pump 28 is activated by a voltage on the memory node N4 to raise the potential of the memory node N4 to virtually the level of the high voltage supply line HIV to program the charge storage device Q14. The second charge pump 28 has two natural MOSFETs Q18, Q19, and an enhancement mode MOSFET Q20. The natural MOSFET Q18 has its channel connected between an external high voltage source line HIV and a second charge pump node N6, and has its gate connected to the memory node N4. The line HIV connected to the natural MOSFET Q18 is preferably the same line HIV connected to the natural MOSFET Q15 of the first charge pump 26. The natural MOSFET Q19 has its channel connected between the memory node N4 and the second charge pump node N6, and has its gate connected to the node N6. The enhancement MOSFET Q20 has its source connected to the external CLOCK signal line, its drain unconnected or floating, and its gate coupled to the pump node N6. The MOSFET Q20 capacitively couples the external clock signal from the CLOCK line to the node N6.

The operation of the second charge pump 28 is essentially identical to that of the first charge pump 26. When a voltage appears at the memory node N4 to turn on the natural MOSFET Q18, a regenerative process controlled by the repetitive pulses on the CLOCK line is begun, to raise the potential of the memory node N4 in a step-wise fashion to virtually the level of the high voltage supply line HIV.

The Store Operation

Figure 2:
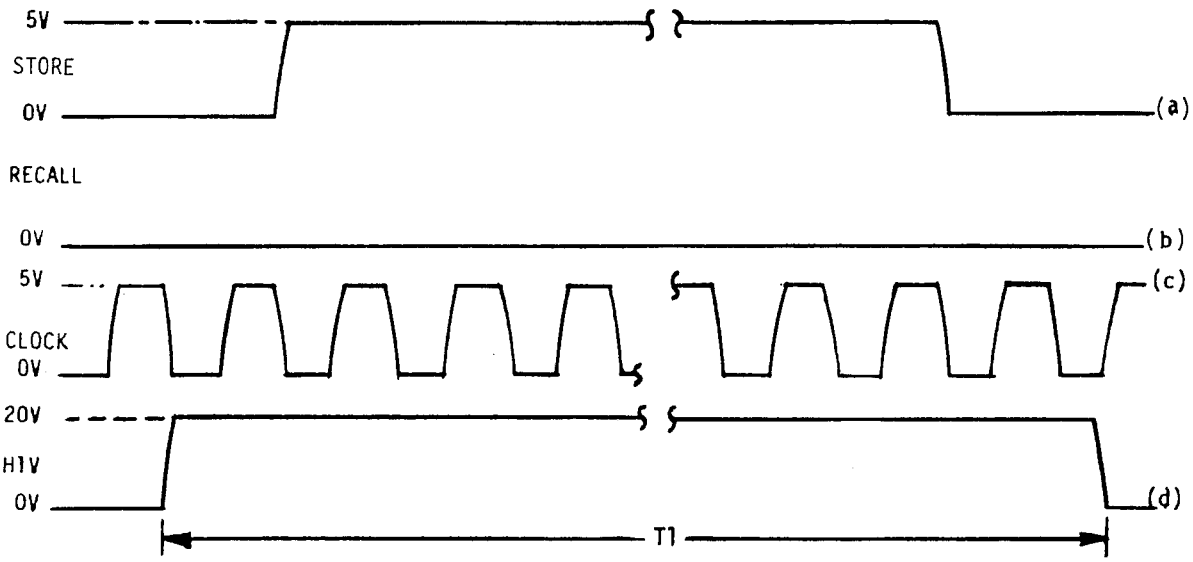
FIG. 2 is a timing diagram for the store cycle waveforms for the memory cell, in which the voltage axis is displayed vertically and the time axis is displayed horizontally.

Referring next to FIG. 2, waveforms for a store cycle operation of the RAM cell 10 are shown. The store cycle is used to transfer the state of the volatile memory element 14 to the non-volatile memory element 22. The waveform (a) shows the electrical signal provided by an external source (not shown) on the STORE line controlling the transistors Q7, Q8, Q9 of the transfer control circuit 16. The waveform (b) shows the electrical signal provided by an external source (not shown) on the RECALL line controlling the operation of the transistors Q10, Q11, Q12 of the transfer control circuit 16. The waveform (c) shows the electrical signal provided by an external clock source (not shown) on the CLOCK line supplied to the charge pumps 26, 28. The waveform (d) shows the electrical signal provided by an external high voltage source (not shown) on the HIV lines supplying the charge pumps 26, 28. Waveforms (a) and (c) make excursions between zero and five volts, waveform (d) makes excursions between zero and twenty volts, and waveform (b) remains at zero volts during the store operation.

When the signal on the STORE line goes high, the state of the volatile element 14 is transferred to the charge pumps 26, 28 of the non-volatile element 22. Bringing the signal on the STORE line high renders the n-channel enhancement mode transistors Q7 and Q9 of the transfer control circuit 16 conductive, to transfer the voltages on the nodes N1 and N2 of the volatile element to the nodes N3, N4, respectively, of the non-volatile element.

If the first node N1 of the volatile element 14 is high (approximately 5 volts) and the second node N2 is low when the signal on the STORE line is brought high, the voltage of the first node N1 will be transferred to the node N3 of the non-volatile element 22, causing the voltage at the node N3 to rise to approximately 3.5 volts. The transistor Q7 is turned off when the voltage on node N3 reaches approximately 3.5 volts. With the voltage at the node N3 high, the first charge pump 26 is activated, as 3.5 volts is sufficient potential to not only turn on the natural MOSFET Q15, but also to turn on the enhancement MOSFET Q17. The clock signal, capacitively coupled from the CLOCK line to the charge pump node N5, will regenerate the transistors Q15, Q16, Q17 until the voltage at the node N3 is eventually brought to virtually the level of the voltage on the line HIV, which, as stated above, is preferably 20 volts.

Holding the signal on the STORE line high while the voltage of the memory node N3 builds ensures that the other memory node N4 is kept at ground potential. With the gate Q9 between the volatile node N2 and the non-volatile node N4 conductive, the volatile node N2 is kept at ground potential through the transistor Q6, and the voltage of the non-volatile node N4 cannot increase. Such an increase might cause the second charge pump 28 to begin increasing the voltage of the node N4. If the transfer gate MOSFET Q9 were turned off, the fourth node N4 would be left floating. The capacitance of the storage transistor Q14 being supplied with the increasingly high voltage of the third node N3 would likely cause the voltage of the node N4 to increase, which would turn on the natural MOSFET Q18, and thus turn on the enhancement MOSFET Q20 to activate the second charge pump 28, which would raise the potential of the node N4 and prevent the proper voltage from being applied across the storage device Q14.

With the voltage at the third node N3 high and the voltage on the fourth node N4 low, negative charges move from the diffusion 38 of the transistor Q14 onto the floating gate 36. Keeping the high voltage across the storage element Q14 for approximately 10 milliseconds programs the floating gate 36. Thus, a negative charge on the floating gate of the storage device Q14 represents the state of the non-volatile element in which the node N3 has a higher potential than does the node N4, which in turn represents the state of the volatile element 14 in which the node N1 has a higher potential than does the second node N2.

If, on the other hand, the second node N2 of the volatile element 14 is high and the first node N1 low when the signal on the STORE line is brought high to store the state of the RAM, the higher voltage of the second node N2 will be transferred to the node N4, and the low voltage of the first node N1 will be transferred to the node N3. The second charge pump 28 will be activated and, through the regenerative action of the transistors Q18, Q19, Q20 capacitively coupled to the clock signal, the node N4 will be brought to virtually the voltage of the high voltage input line HIV. The voltage of the node N3 is kept at a low potential by keeping the gate transistor Q7 of the transfer control circuit conductive.

With the voltage of the node N4 substantially higher than the voltage of the node N3, positive charge is placed on the floating gate 36 of the storage device Q14. Thus, a positive charge on the floating gate of the storage element represents the state of the non-volatile element in which the node N3 has a lower potential than the node N4, which in turn represents the state of the volatile element 14 in which the potential of the first node N1 is lower than the potential of the second node N2.

The charge on the floating gate 36 of the storage device Q14 of the memory element 24 therefore represents the stored state of the memory cell 10. That charge remains in place even after power is removed from the cell circuit for an indefinite length of time, and thus the state of the non-volatile memory element 22 is retained after the device containing the memory is powered down.

The Recall Operation

Figure 3:
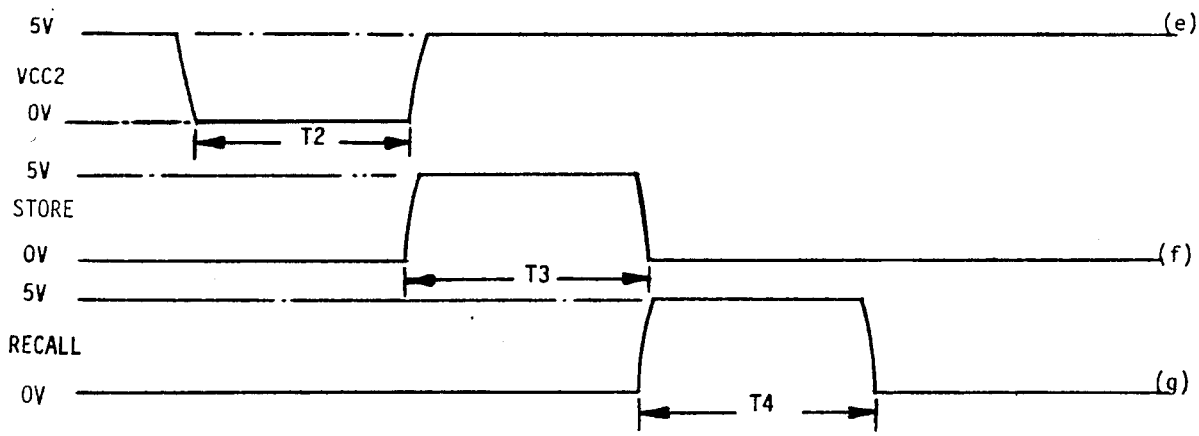
FIG. 3 is a timing diagram for the recall cycle waveforms for the memory cell, in which voltage amplitude is displayed vertically and time is displayed horizontally.

Referring next to FIG. 3, waveforms for a recall cycle operation of the RAM cell 10 are shown. A recall cycle is used to transfer the state of the non-volatile memory element 22 to the volatile memory element 14. The waveform (e) shows the electrical signal provided by an external voltage supply (not shown) on the voltage supply line VCC2 connected to the transistor Q4. The waveform (f) shows the electrical signal provided by an external source (not shown) on the STORE line controlling the transistors Q7, Q8, Q9 of the transfer control circuit 16. The waveform (g) shows the electrical signal provided by an external source (not shown) on the RECALL line connected to the gates of the transistors Q10, Q11, Q12 of the control circuit 16. The waveforms (e), (f), and (g) make excursions between zero and five volts. No pulsing signal is provided on the CLOCK line during the recall operation. In addition, no voltage is needed on the line HIV.

To recall the state of the memory from the non-volatile element 22 and place it onto the volatile element 14 for general use and retrieval through the data lines DB and $\overline{DB}$, the volatile element is first placed in a predetermined state. The sensing element Q13 of the non-volatile element 22 senses the state of the storage element Q14 and, in response, causes the volatile element to either remain in the established predetermined state, or to flip to the other stable state.

To perform the recall function in the preferred embodiment shown, the input voltage VCC2 is brought low for approximately one microsecond to force the first node N1 of the volatile element high and place the volatile element in its stable state in which the first node N1 is high and the second node N2 is low. The signal on the STORE line is then brought high for approximately one microsecond to cause the transistor Q7 of the transfer control circuit 16 to be conductive and cause a voltage to be applied to the node N3. The voltage applied at the node N3 rises to approximately 2–3 volts, which is the depletion threshold of the transistor Q10. This voltage on the node N3 is used in the recall operation as a bias voltage. Because no signal is applied to the CLOCK line during the recall operation, the voltage on the third node N3 does not activate the first charge pump 26.

The charge on the floating gate 36 of the storage element Q14 is also present on the floating gate 32 of the sensing element Q13. The charge on the floating gate 32 affects the threshold voltage of the sensing transistor Q13. That effect on the threshold voltage is used to transfer the state of the storage device Q14 to the volatile memory 14.

A negative charge on the floating gate 32, which corresponds to a negative charge on the floating gate 36 of the storage device Q14, raises the threshold voltage of the sensing transistor Q13 so the bias voltage is insufficient to render the transistor Q13 conductive. Conversely, a positive charge on the floating gate 32 lowers the threshold voltage of the device Q13 sufficiently that the bias voltage applied to the node N3 ensures that the transistor Q13 is conductive. The positive charge applied during the store operation may itself be sufficient to turn the transistor Q13 on.

The bias voltage at the node N3 is applied to the control gate 30 of the sense element Q13. That bias voltage is either above or below the threshold for the transistor. If the bias voltage is below the threshold voltage, the transistor Q13 remains off, and the output line 20 is not connected to ground.

If the bias voltage at the node N3 and applied to the control gate 30 is above the threshold, the transistor Q13 is above the threshold, the transistor Q13 is turned on, if the charge on the floating gate 32 has not already turned the transistor on. With the transistor Q13 conductive, the sense output line 20 is brought low to ground potential.

After the sense transistor Q13 has been rendered either conductive or non-conductive to indicate the charge stored on the floating gate of the storage device Q14, the signal on the RECALL line is brought high to transfer the sensed state of the non-volatile element to the volatile memory element.

Bringing the signal on the RECALL line high renders the enhancement MOSFET gate Q11 conductive to connect the sense output line 20 to the volatile memory input line 18. If the sense transistor is off, the volatile memory input line 18, which is connected to the first node N1, remains at the high voltage established.

As was discussed above, a negative charge stored on the floating gate 36 of the storage device Q14, represents the state in which the node N3 is at a higher potential than the node N4, which corresponds to the volatile memory state in which the potential of the node N1 is higher than the potential of the node N2. Thus, it is seen that state of the volatile element stored in the non-volatile memory is restored to the volatile element 14.

If the sense transistor Q13 is on when the gate transistor Q11 is rendered conductive, the input line 18 is connected to the ground potential and the first node N1 is pulled low, and the volatile element 14 is flipped from its pre-established state. The storage of a positive charge on the floating gate 36 of the storage device Q14 represents the state in which the potential of the node N4 is higher than the potential of the node N3 in the non-volatile element, which corresponds to the state of the volatile element in which the second node N2 has a higher potential than the first node N1. Thus, it is seen that the state stored in the storage device Q14 is restored to the volatile element 14 during the recall operation.

I claim:

1. A memory cell circuit comprising:
   a flip-flop having first and second stable states;
   means for establishing said flip-flop in said first state;
   a non-volatile storage element having first and second states corresponding to said first and second states of said flip-flop, respectively, said non-volatile element including a terminal having a predetermined voltage when said non-volatile element is in said second state; and
   a transfer circuit connected to said flip-flop and to said non-volatile element, for selectively connecting said flip-flop to said terminal after said flip-flop has been established in said first state, so that when said terminal has said predetermined voltage said flip-flop is flipped to said second state, but that when said terminal does not have said predetermined voltage said flip-flop remains in said first state.

2. The memory cell circuit of claim 1 wherein said transfer circuit selectively transfers the state of said flip-flop to said non-volatile element.

3. The memory cell circuit of claim 2 wherein said non-volatile element comprises:
   a charge storage device for storing a charge representative of the state of said non-volatile element; and
   a sensing element for connecting a source of said predetermined voltage to said terminal when said charge storage device stores a charge representative of said second state.

4. The memory cell circuit of claim 3 wherein :
   said charge storage device comprises a first floating gate MOSFET having a control gate, a floating gate, and a diffusion; and
   said sensing element comprises a second floating gate MOSFET having a control gate, a floating gate, and a channel, and having its floating gate connected to the floating gate of said first floating gate MOSFET and having its channel connected between said terminal and said voltage source.

5. The memory cell circuit of claim 4 additionally comprising:
   a first charge pump connected to the control gate of said charge storage device; and
   a second charge pump connected to the diffusion of said charge storage device;
   wherein, to place said non-volatile element in said first state, said first charge pump is turned on to apply a voltage to said control gate of said charge storage device and place a first charge on said floating gate; and
   wherein, to place said non-volatile element in said second state, said second charge pump is turned on to apply a voltage to said diffusion of said charge storage device and place a second charge on said floating gate.

6. The memory cell circuit of claim 5 wherein:

said first charge pump is connected so that when said transfer circuit transfers said first state of said flip-flop to said non-volatile element, said first charge pump is turned on; and said second charge pump is connected so that when said transfer circuit transfers said second state of said flip-flop to said non-volatile element, said second charge pump is turned on.

7. A memory cell circuit comprising:
a volatile cell including first and second nodes having first and second stable states;
a non-volatile cell including:
 third and fourth nodes selectively connectable to said first and second nodes;
 a charge storage device connected to said third and fourth nodes for storing a first or second charge representative of the state of said third and fourth nodes; and
 a sensing device selectively connectable to said volatile cell and responsive to said charge storage device to cause a predetermined voltage to be supplied to one of said volatile cell nodes, but not to the other to cause said volatile element nodes to assume a predetermined one of their states depending on the charge stored on said charge storage device; wherein said sensing device includes:
  an output terminal that is coupled to a predetermined voltage source when said charge storage device is storing said second charge, and
  a transfer control circuit for selectively coupling one of said volatile element nodes to said output terminal.

8. The memory cell circuit defined in claim 7 wherein:
said third and fourth nodes have first and second states corresponding to the first and second states of said first and second nodes, respectively;
said charge storage device stores first and second charges representative of the first and second states of said third and fourth nodes, respectively;
said terminal has said predetermined voltage when said charge storage device has said second charge; and
said transfer circuit selectively connects said predetermined volatile cell node to said terminal to cause said node to attain substantially the same voltage as said terminal when said charge storage device has said second charge to cause said volatile cell to assume said second state.

9. The memory cell circuit of claim 7, additionally comprising means for establishing said volatile cell in said first state before said transfer control circuit couples said volatile element node to said output terminal.

10. A memory cell circuit comprising:
a volatile cell including first and second nodes having first and second stable states:
a non-volatile cell including:
 third and fourth nodes having first and second states corresponding to the first and second states of said first and second nodes, respectively;
 a charge storage device for storing first and second charges representative of the first and second states of said third and fourth nodes, respectively; and a terminal having a predetermined voltage when said charge storage device is storing said second charge; and
a transfer circuit for selectively transferring the state of said first and second nodes to said third and fourth nodes, and for selectively connecting a predetermined one of said volatile cell nodes to said terminal so that when said charge storage device has said second charge and said terminal is at said predetermined voltage, said connected volatile cell node attains substantially the same voltage as said terminal to cause said volatile cell to assume said second state; and wherein:
said charge storage device comprises a first floating gate field effect transistor wherein said first and second charges are stored on the floating gate thereof; and
said non-volatile cell further comprises a sensing device comprising a second floating gate field effect transistor having a control gate, a floating gate, and a channel, and having its floating gate connected to the floating gate of said first floating gate field effect transistor, and having its channel connected between said terminal and a source of said predetermined voltage.

11. A memory cell circuit comprising:
a volatile cell including first and second nodes having first and second stable states;
a non-volatile cell including third and fourth nodes, a charge storage device for storing a charge representative of the state of said third and fourth nodes, and a terminal having a predetermined voltage when said charge storage device stores a charge representative of a predetermined one of the states of said third and fourth nodes;
a transfer circuit for selectively transferring the state of said first and second nodes to said third and fourth nodes, and for selectively connecting a predetermined one of said volatile cell nodes to said terminal so that if said terminal is at said predetermined voltage said connected volatile cell node attains essentially the same voltage as said terminal;
a first charge pump connected to said third node so that when a voltage is transferred from said first node to said third node, said first charge pump is turned on; and
a second charge pump connected to said fourth node so that when a voltage is transferred from said second node to said fourth node, said second charge pump is turned on.

12. A memory cell circuit comprising:
a volatile memory element comprising first and second output nodes and having two stable states;
a non-volatile memory element comprising:
 third and fourth nodes selectively connectable to said first and second nodes;
 a first charge pump connected to said third node and to a first high voltage source, wherein said first charge pump is responsive to a voltage on said third node to apply substantially said high voltage to said third node;
 a second charge pump connected to aid fourth node and to a second high voltage source, wherein said second charge pump is responsive to a voltage on said fourth node to apply substantially said high voltage to said fourth node;
 charge storage device means connected to aid third and fourth nodes for storing a charge in response to a voltage difference between said thrid and fourth nodes; and a sensing device selectively connectable to said volatile memory element and responsive to said charge storage device to cause a predetermined voltage to be supplied to one of said volatile memory element nodes, but not to the other node, to cause said volatile element to assume a predetermined one of its states depending on the charge stored on said charge storage device.

13. The memory cell circuit of claim 12 wherein : said first charge pump comprises:

a first FET having a gate and a channel, and having its gate connected to said third node and its channel connected between said high voltage source and a first charge pump node;

a second FET having a gate and a channel, and having its gate connected to said first charge pump node and its channel connected between said first charge pump node and said third memory node; and a third FET having a gate and a channel, and having its gate connected to said first charge pump node and another terminal connected to a clock line to capacitively couple said clock line to said first charge pump node; said second charge pump comprises:

a fourth FET having a gate and a channel, and having its gate connected to said fourth node and its channel connected between said high voltage source and a second charge pump node;

a fifth FET having a gate and a channel, and having its gate connected to said second charge pump node and its channel connected between said second charge pump node and said fourth memory node; and a sixth FET having a gate and a channel, and having its gate connected to said second charge pump node and another terminal connected to said clock line to capacitively couple said clock line to said second charge pump node.

14. The memory cell circuit of claim 13 wherein said first, second, fourth, and fifth FETs are natural MOSFETs requiring little voltage to render them conductive.

15. The memory cell circuit of claim 12, wherein said sensing device comprises:

an output terminal that is coupled to a predetermined voltage source when said charge storage device is storing a first charge; and a transfer control circuit for selectively coupling one of said volatile element nodes to said output terminal.

16. The memory cell circuit of claim 12 wherein said first and second high voltage sources are the same.

17. A method of non-volatilely storing and retrieving a data bit comprising:

establishing in a volatile flip-flop memory cell having two stable states a state representative of said bit;

transferring said state to a non-volatile cell;

storing a charge representative of said state on a charge storage element in said non-volatile cell;

following said storing step, establishing a predetermined one of said stable states in said volatile cell;

sensing the charge on said charge storage element to cause a predetermined voltage to be applied to an output terminal; and connecting a node of said flip-flop to said output terminal to cause said filp-flop to change states if said voltage is applied to said output terminal, or to remain in said predetermined state if said voltage is not applied to said output terminal.

18. The method of claim 17 wherein:

said step of transferring the state of said volatile cell to said non-volatile cell comprises transferring the state of said volatile cell to a pair of nodes in said non-volatile cell;

said step of storing a charge on said charge storage element comprises:

activating a charge pump in response to a voltage on one of said non-volatile cell nodes to change the voltage of one of said nodes relative to the other; and applying said changed voltage across said charge storage element to store said charge representative of said state.

19. The method of claim 18, wherein said step of transferring the state of said volatile cell to said nodes in said non-volatile cell causes the voltage of said non-volatile cell nodes to rise, activating said charge pump.

20. The method of claim 17 wherein said step of sensing the charge on said charge storage element comprises:

biasing a sensing element to either connect a terminal to a predetermined voltage or not depending on the charge stored in said charge storage element; and connecting said terminal to a node of said volatile element.

* * * * *